United States Patent
Yu et al.

(10) Patent No.: US 6,706,571 B1
(45) Date of Patent: Mar. 16, 2004

(54) METHOD FOR FORMING MULTIPLE STRUCTURES IN A SEMICONDUCTOR DEVICE

(75) Inventors: Bin Yu, Cupertino, CA (US); Judy Xilin An, San Jose, CA (US); Cyrus E. Tabery, Sunnyvale, CA (US); Haihong Wang, Fremont, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 25 days.

(21) Appl. No.: 10/274,951

(22) Filed: Oct. 22, 2002

(51) Int. Cl.$^7$ .................. H01L 21/00; H01L 21/84; H01L 21/336
(52) U.S. Cl. ............. 438/157; 438/283; 438/286; 438/585
(58) Field of Search .................. 438/283, 286, 438/157, 585

(56) References Cited

U.S. PATENT DOCUMENTS

| | | | | |
|---|---|---|---|---|
| 4,838,991 A | * | 6/1989 | Cote et al. ................. 216/46 |
| 5,989,952 A | * | 11/1999 | Jen et al. ................. 438/253 |
| 6,391,782 B1 | * | 5/2002 | Yu ................. 438/696 |
| 6,461,900 B1 | * | 10/2002 | Sundaresan et al. ........ 438/156 |
| 6,492,212 B1 | * | 12/2002 | Ieong et al. ............... 438/157 |
| 6,501,134 B1 | * | 12/2002 | Krivokapic ................. 257/350 |
| 6,514,819 B1 | * | 2/2003 | Choi ................. 438/253 |
| 2003/0006410 A1 | * | 1/2003 | Doyle ................. 257/20 |

OTHER PUBLICATIONS

Digh Hisamoto et al., "FinFET–A Self–Aligned Double–Gate MOSFET Scalable to 20 nm," IEEE Transactions on Electron Devices, vol. 47, No. 12, Dec. 2000, pp. 2320–2325.

Yang–Kyu Choi et al., "Sub–20nm CMOS FinFET Technologies," 2001 IEEE, IEDM, pp. 421–424.

Xuejue Huang et al., "Sub–50 nm P–Channel FinFET," IEEE Transactions on Electron Devices, vol. 48, No. 5, May 2001, pp. 880–886.

Xuejue Huang et al., "Sub 50–nm FinFET: PMOS," 1999 IEEE, IEDM, pp. 67–70.

Yang–Kyu Choi et al., "Nanoscale CMOS Spacer FinFET for the Terabit Era," IEEE Electron Device Letters, vol. 23, No. 1, Jan. 2002, pp. 25–27.

* cited by examiner

Primary Examiner—John Niebling
Assistant Examiner—Jennifer M. Kennedy
(74) Attorney, Agent, or Firm—Harrity & Snyder LLP (57) ABSTRACT

A method of forming multiple structures in a semiconductor device includes depositing a film over a conductive layer, etching a trench in a portion of the film and forming adjacent the sidewalls of the trench. The film may then be etched, followed by an of the conductive layer to form the structures.

19 Claims, 10 Drawing Sheets

METHOD FOR FORMING MULTIPLE STRUCTURES IN A SEMICONDUCTOR DEVICE

TECHNICAL FIELD

The present invention relates to semiconductor devices and methods of manufacturing semiconductor devices. The present invention has particular applicability to double-gate devices.

BACKGROUND ART

The escalating demands for high density and performance associated with ultra large scale integration semiconductor devices require design features, such as gate lengths, below 100 nanometers (nm), high reliability and increased manufacturing throughput. The reduction of design features below 100 nm challenges the limitations of conventional methodology.

For example, when the gate length of conventional planar metal oxide semiconductor field effect transistors (MOSFETs) is scaled below 100 nm, problems associated with short channel effects, such as excessive leakage between the source and drain, become increasingly difficult to overcome. In addition, mobility degradation and a number of process issues also make it difficult to scale conventional MOSFETs to include increasingly smaller device features. New device structures are therefore being explored to improve FET performance and allow further device scaling.

Double-gate MOSFETs represent new structures that have been considered as candidates for succeeding existing planar MOSFETs. In double-gate MOSFETs, two gates may be used to control short channel effects. A FinFET is a recent double-gate structure that exhibits good short channel behavior. A FinFET includes a channel formed in a vertical fin. The FinFET structure may be fabricated using layout and process techniques similar to those used for conventional planar MOSFETs.

DISCLOSURE OF THE INVENTION

Implementations consistent with the present invention provide methodology for forming multiple fins for use in a FinFET device. The fins, consistent with the present invention, may be formed with a small pitch.

Additional advantages and other features of the invention will be set forth in part in the description which follows and in part will become apparent to those having ordinary skill in the art upon examination of the following or may be learned from the practice of the invention. The advantages and features of the invention may be realized and obtained as particularly pointed out in the appended claims.

According to the present invention, the foregoing and other advantages are achieved in part by a method of forming multiple fins in a FinFET device. The method includes depositing a dielectric layer over a silicon on insulator (SOI) wafer, where the SOI wafer includes a conductive layer on an insulating layer. The method also includes forming a resist mask over portions of the dielectric layer and etching a trench in a portion of the dielectric layer not covered by the resist mask, where the trench has two side walls. The method further includes forming spacers adjacent the two sidewalls of the trench, etching the dielectric layer to form dielectric structures located below the spacers, etching the conductive layer to form the fins and removing the spacers and the dielectric structures.

According to another aspect of the invention, a method of manufacturing a semiconductor device is provided. The method includes depositing a film over a conductive layer, where the conductive layer is used to form a plurality of fin structures. The method also includes etching at least one trench in a portion of the film, where a first trench has two side walls. The method further includes forming spacers adjacent the two sidewalls of the first trench and etching the film, where the etching terminates on the conductive layer. The method also includes etching the conductive layer to form the fin structures, forming a source region and a drain region, depositing a gate material over the fin structures and patterning and etching the gate material to form at least one gate electrode.

Other advantages and features of the present invention will become readily apparent to those skilled in this art from the following detailed description. The embodiments shown and described provide illustration of the best mode contemplated for carrying out the invention. The invention is capable of modifications in various obvious respects, all without departing from the invention. Accordingly, the drawings are to be regarded as illustrative in nature, and not as restrictive.

BRIEF DESCRIPTION OF THE DRAWINGS

Reference is made to the attached drawings, wherein elements having the same reference number designation may represent like elements throughout.

BEST MODE FOR CARRYING OUT THE INVENTION

The following detailed description of the invention refers to the accompanying drawings. The same reference numbers in different drawings may identify the same or similar elements. Also, the following detailed description does not limit the invention. Instead, the scope of the invention is defined by the appended claims and their equivalents.

Implementations consistent with the present invention provide double gate FinFET devices with multiple fins and methods of manufacturing such devices. The fins formed in accordance with the present invention may have a small pitch (i.e., distance between the fins) based on the particular device requirements.

Figure 1:
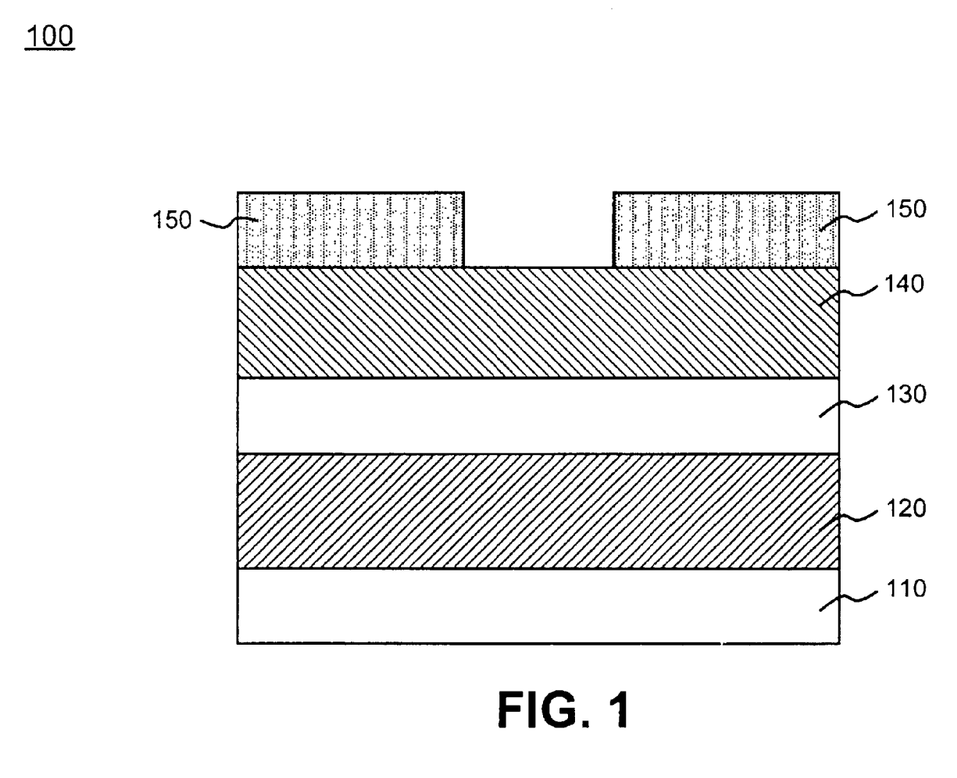
FIGS. 1–7 are cross-sectional views illustrating exemplary processing for forming fins in accordance with an embodiment of the present invention.

FIG. 1 illustrates the cross-section of a semiconductor device 100 formed in accordance with an embodiment of the present invention. Referring to FIG. 1, semiconductor device 100 may include a silicon on insulator (SOI) structure that includes a silicon substrate 110, a buried oxide layer 120 and a silicon layer 130 on the buried oxide layer 120. Buried oxide layer 120 and silicon layer 130 may be formed on substrate 110 in a conventional manner.

In an exemplary implementation, buried oxide layer 120 may include a silicon oxide, such as $SiO_2$, and may have a thickness ranging from about 1500 Å to about 3000 Å. Silicon layer 130 may include monocrystalline or polycrystalline silicon having a thickness ranging from about 200 Å to about 1000 Å. Silicon layer 130 is used to form multiple active lines or fins for a double gate transistor device, as described in more detail below.

In alternative implementations consistent with the present invention, substrate 110 and layer 130 may comprise other semiconducting materials, such as germanium, or combinations of semiconducting materials, such as silicon-germanium. Buried oxide layer 120 may also include other dielectric materials.

A dielectric layer 140, such as a silicon oxide layer, may be formed over silicon layer 130 to act as a protective mask during subsequent etching processes. In an exemplary implementation, dielectric layer 140 may comprise $SiO_2$ and may be deposited using chemical vapor deposition (CVD) to a thickness ranging from about 300 Å to about 1000 Å. In other implementations consistent with the present invention, layer 140 may consist of other films or materials that may be deposited or grown, including conductive materials or other non-conductive materials.

Next, a photoresist material may be deposited and patterned to form a photoresist mask 150, as illustrated in FIG. 1. The photoresist may be deposited and patterned in any conventional manner. The dielectric layer 140 and photoresist mask 150 may be used to facilitate the formation of a number of active lines, as described in more detail below.

Figure 2:
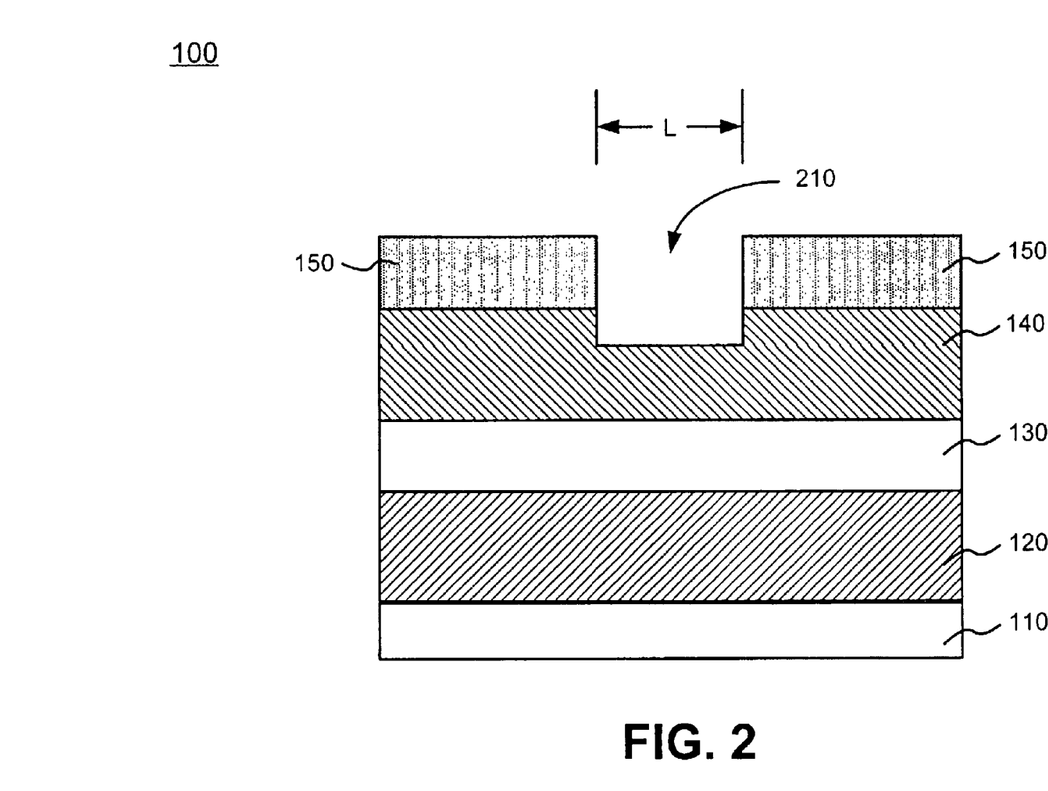

Semiconductor device 100 may then be etched. In an exemplary implementation, dielectric layer 140 may be etched to form trench 210, as illustrated in FIG. 2. Referring to FIG. 2, the cross-sectional width of the trench 210 is represented by L. In an exemplary implementation, L may range from about 1000 Å to about 3000 Å. It should be understood, however, that the particular value of L may vary based on the particular circuit requirements associated with the fins in the FinFET device that will be formed. In addition, the depth of trench 210 from the top surface of dielectric layer 140 may range from, for example, about 300 Å to about 1000 Å.

Figure 3:
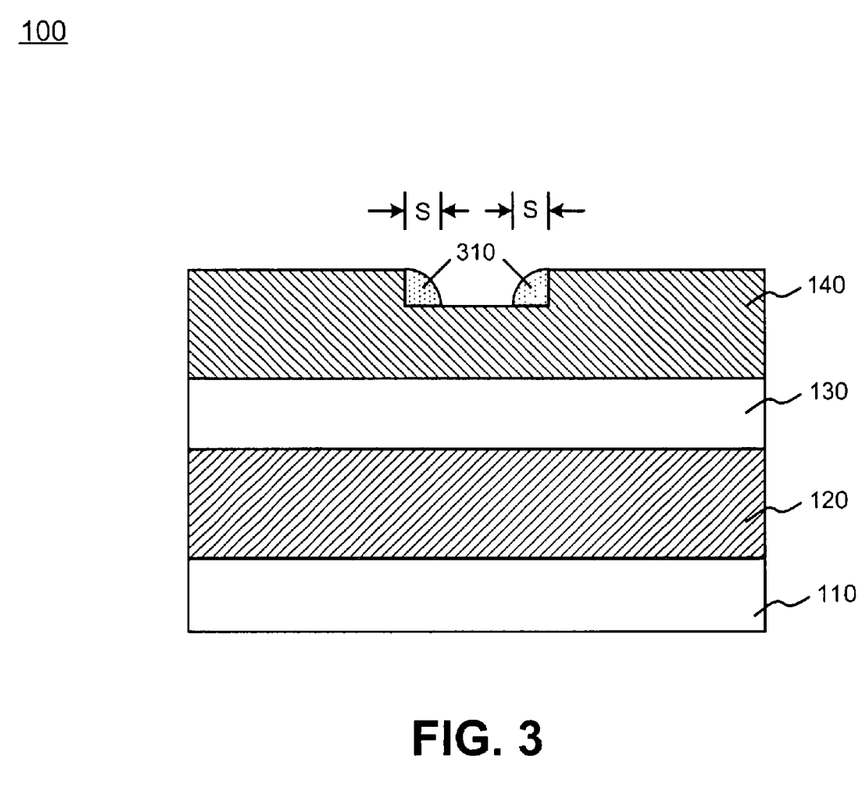

After the trench 210 has been formed, a material, such as polysilicon, may be deposited and etched in a conventional manner to form trench spacers 310, as illustrated in FIG. 3. The trench spacers 310 may be used as a hard mask to facilitate the formation of fins, as described in more detail below. The width of trench spacers 310 is illustrated in FIG. 3 as "S." In an exemplary implementation, S may range from about 100 Å to about 500 Å. However, the particular width of trench spacers 310 (and the value of S) may be set based on the desired pitch associated with the subsequently formed fins.

Figure 4:
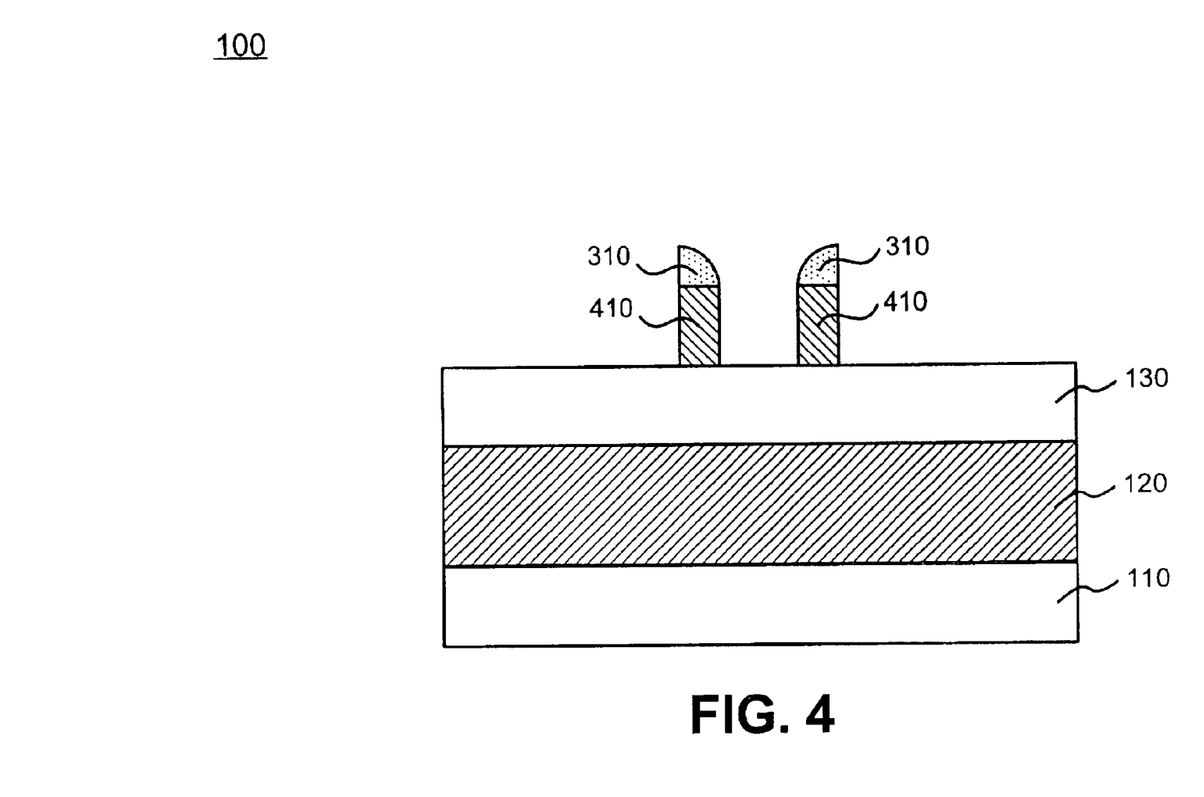

After the formation of trench spacers 310, dielectric layer 140 may be etched, with the etching terminating on silicon layer 130 as illustrated in FIG. 4. Referring to FIG. 4, the trench spacers 310 protect the material in dielectric layer 140 located below the trench spacers 310 from being etched, resulting in dielectric structures 410.

Figure 5:
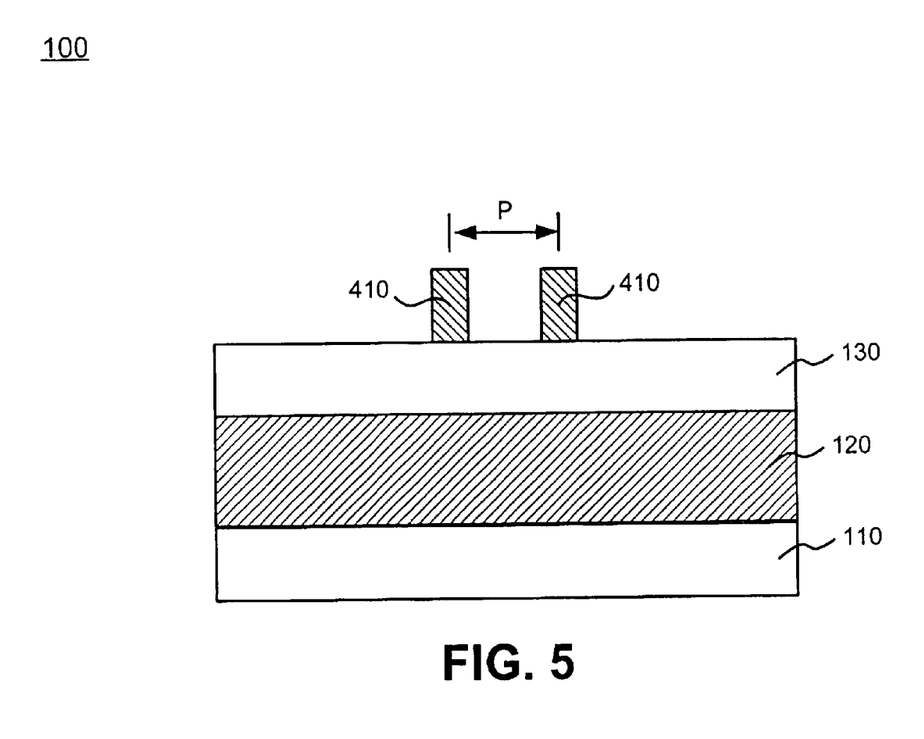

After the dielectric layer 140 is etched to form dielectric structures 410, the trench spacers 310 may be removed, as illustrated in FIG. 5. Referring to FIG. 5, the center-to-center distance between the dielectric structures 410, referred to as the pitch, is represented by P. In the exemplary implementation described above, the value of P is based on both the width of trench 210 ("L" in FIG. 2) and the width of trench spacers 310 ("S" in FIG. 3). More particularly, the pitch P is equal to L minus S. That is, P=L−S. The particular value of P that may be obtained in accordance with the present invention may be very small, e.g., as small as about 500 Å. However, as discussed above, it should be understood that the particular value of P may vary based on the particular circuit requirements associated with the fins and double gate device that will be formed.

Figure 6:
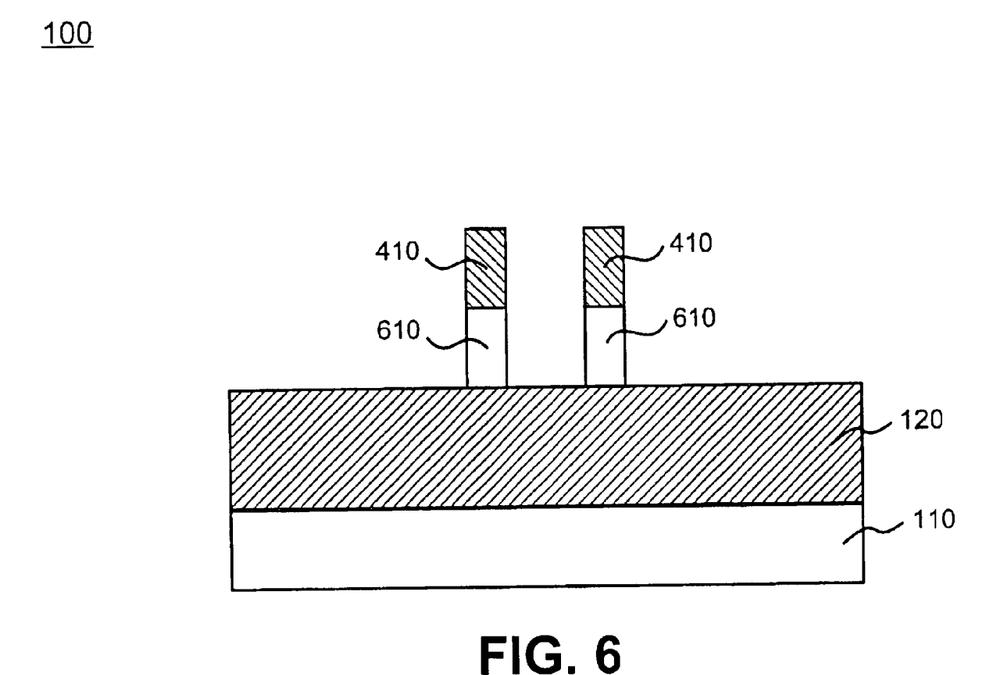

Silicon layer 130 may then be etched, with the etching terminating on buried oxide layer 120, as illustrated in FIG. 6. During the etching, dielectric structures 410 act as a mask to protect the silicon material in silicon layer 130 located below the dielectric structures 410 from being etched, resulting in fin structures 610 illustrated in FIG. 6.

Figure 7:
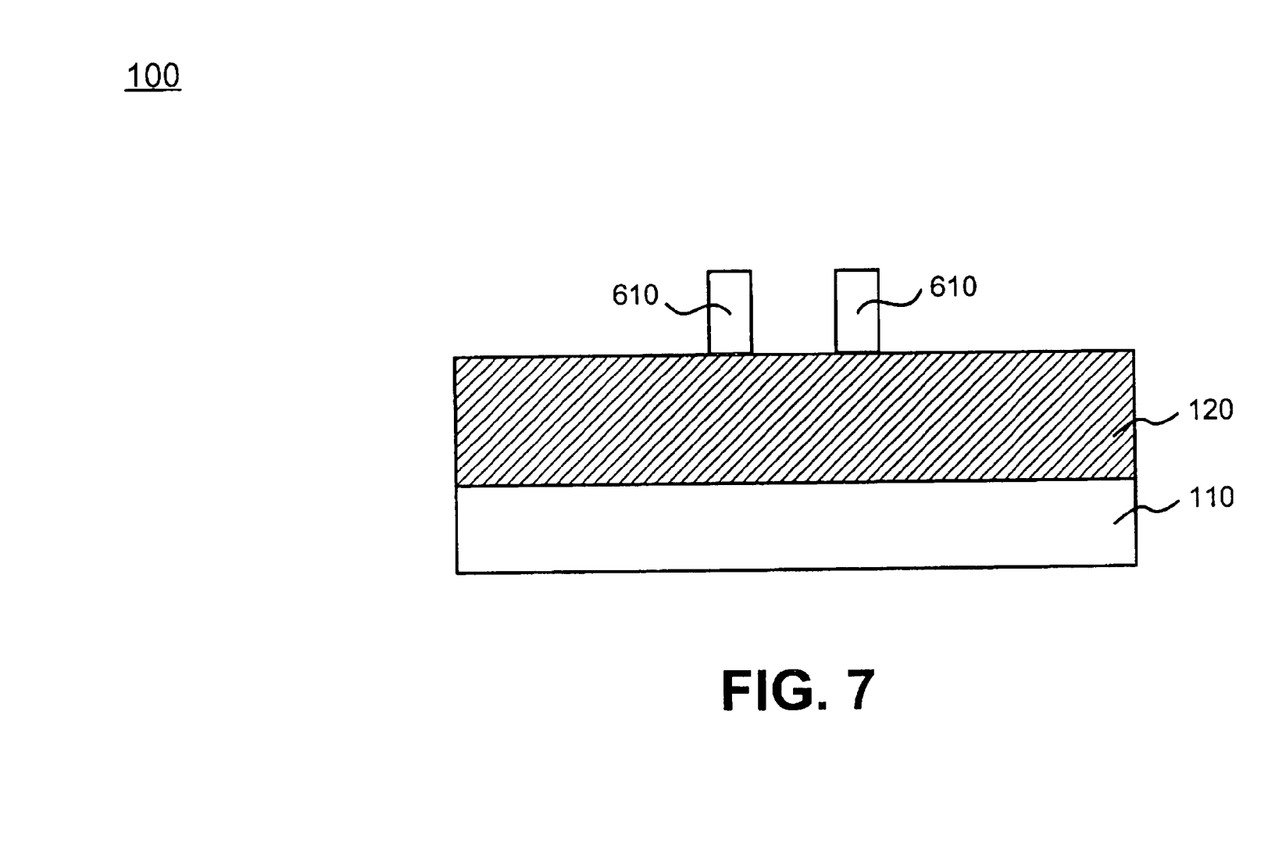

Dielectric structures 410 may then be removed, for example, via a planarization process, resulting in fin structures 610 illustrated in FIG. 7. Fin structures 610 may be used as fins in a FinFET device or as active lines in other devices. Advantageously, the pitch P of the fins formed in accordance with the present invention may be very small.

Figure 8:
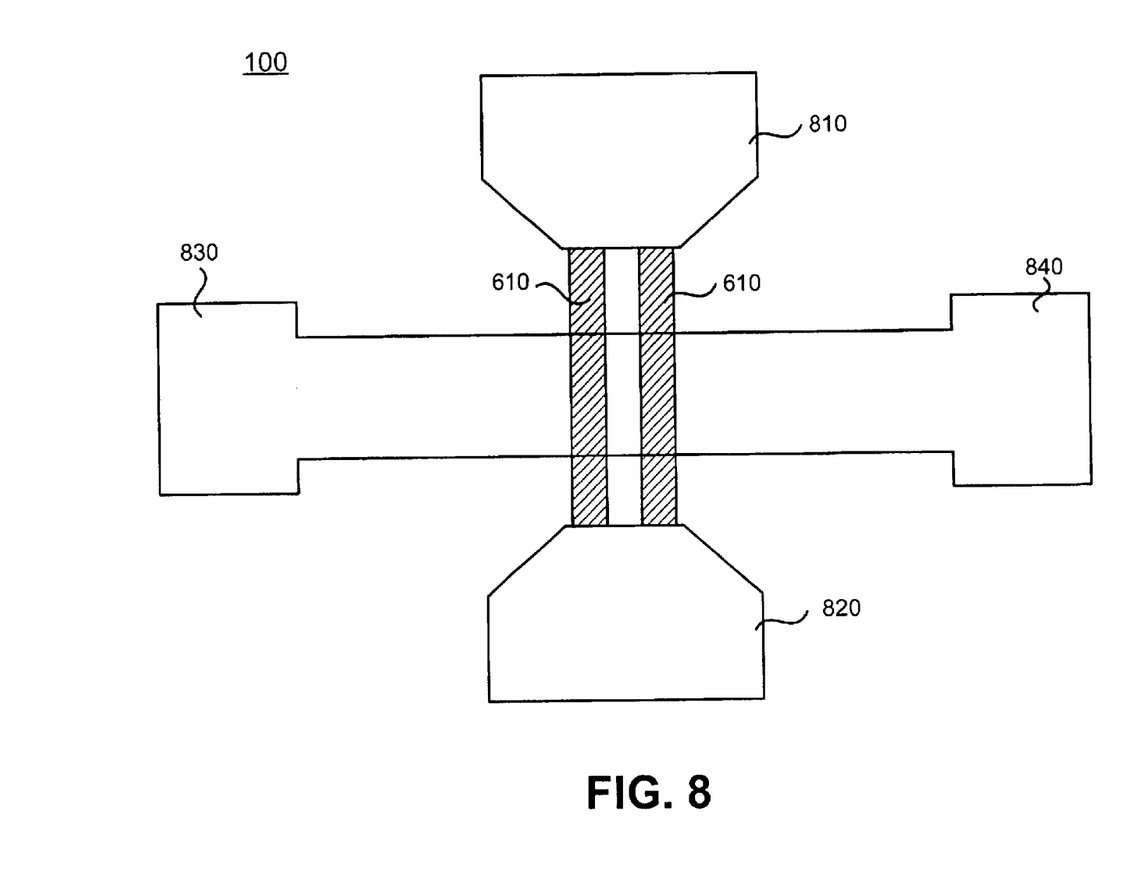
FIG. 8 is a top view illustrating an exemplary double gate device formed in accordance with an exemplary embodiment of the present invention.

After the fins 610 are formed, a protective dielectric layer, such as a silicon nitride or silicon oxide may be formed on the top surface of fins 610, followed by the formation of a gate dielectric on the side surfaces of the fins 610. Source/drain regions may then be formed at the respective ends of the fins 610, followed by formation of one or more gates. For example, a silicon layer, germanium layer, combinations of silicon and germanium or various metals may be used as the gate material. The gate material may then be patterned and etched to form the gate electrodes. For example, FIG. 8 illustrates a top view of semiconductor device 100 consistent with the present invention after the source/drain regions and gate electrodes are formed. As illustrated, semiconductor device 100 includes a double gate structure with fins 610, source drain regions 810 and 820, and gate electrodes 830 and 840.

The source/drain regions 810 and 820 may then be doped with n-type or p-type impurities based on the particular end device requirements. In addition, sidewall spacers may optionally be formed prior to the source/drain ion implantation to control the location of the source/drain junctions based on the particular circuit requirements. Activation annealing may then be performed to activate the source/drain regions 810 and 820.

The present invention has been described above as forming two fins. The methodology of the present invention, however, may be used to form any number of fins, based on the particular circuit requirements. For example, if more than two fins are required, multiple trenches may be formed in dielectric layer 140 (FIG. 2). The processing for forming the fins may then proceed as described above with respect to FIGS. 3–7. In this case, the distance between neighboring trenches may be set to a predetermined distance so that the fin subsequently formed below one of the trenches is located the desired distance from another fin subsequently formed below a neighboring trench.

Thus, in accordance with the present invention, a FinFET device may be formed with multiple fins having a small pitch. Advantageously, the methodology for forming fins in accordance with the present invention allows multiple fins to be formed more closely together than that realized in conventional processing. Having multiple fins enables the resulting semiconductor device to increase the channel width per device as compared to a single fin FinFET device. In addition, by forming the multiple fins more closely together, the present invention is able to provide more fins in a smaller area than that obtained using conventional processes. Therefore, the present invention provides increased flexibility and can be easily integrated into conventional processing.

OTHER EMBODIMENTS

Figure 9A:
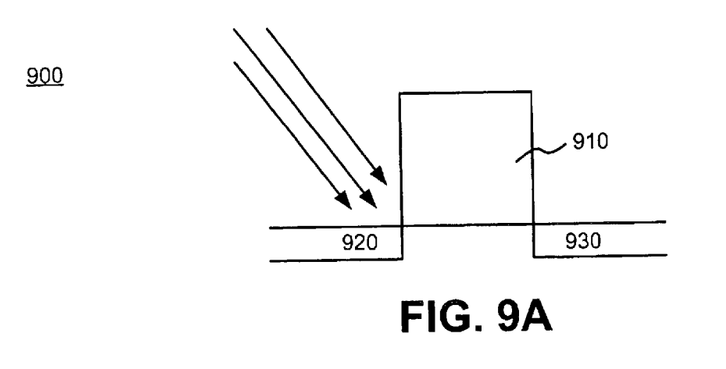
FIGS. 9A and 9B are cross-sections illustrating the formation of asymmetrical source/drain regions in accordance with another embodiment of the present invention.

In other embodiments of the present invention, FinFETs with asymmetrical source/drain extensions may be formed. For example, FIG. 9A illustrates a cross-sectional view of semiconductor device 900 that includes gate 910, source region 920 and drain region 930. The semiconductor device 900 may be a FinFET device. The fin(s) in device 900, however, are not shown for simplicity.

Figure 9B:
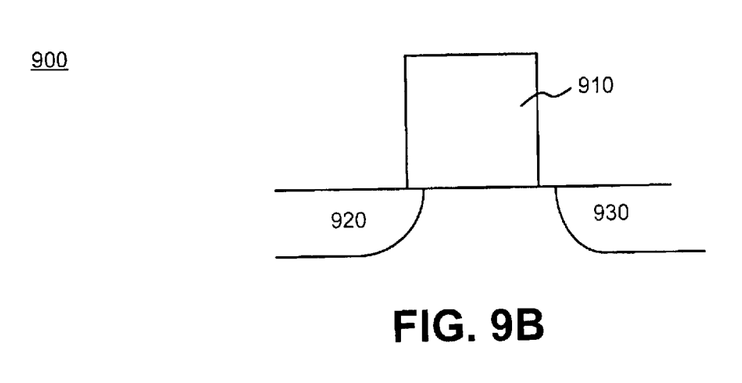

In any event, after the fin(s), source/drain regions 920 and 930 and the gate 910 are formed, impurities may be ion implanted into the source/drain regions 920 and 930. In an exemplary implementation, a tilt angle implant process may be performed to dope the source and drain regions 920/930 as indicated by the arrows in FIG. 9A. After the tilt angle implant, the source region 920 and drain region 930 may be asymmetrical with respect to gate 910, as illustrated in FIG. 9B. That is, the source region 920 may extend laterally below gate 910, while drain region 930 may not extend laterally below gate 910, as illustrated in FIG. 9B. In this manner, the FinFET 900 may include asymmetrical source/drain extension regions.

Figure 10:
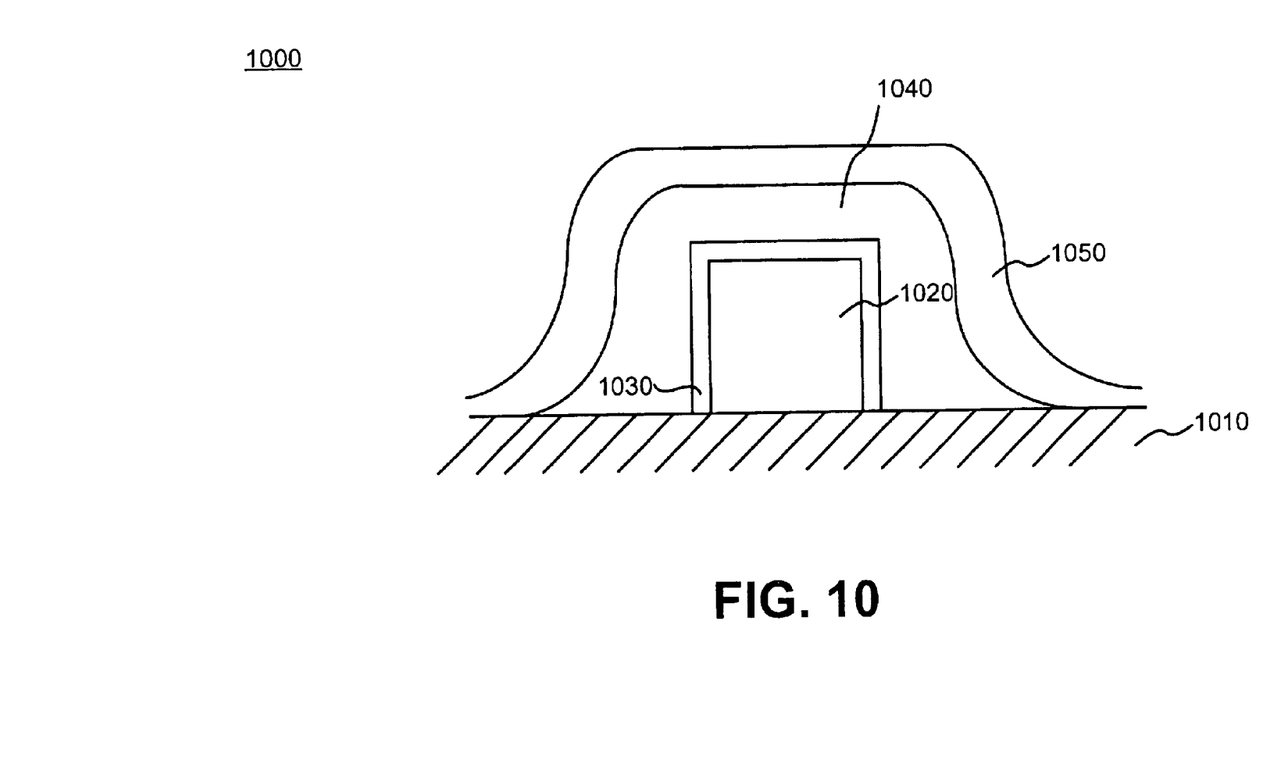
FIG. 10 is a cross-section illustrating the formation of a gate in accordance with another embodiment of the present invention.

In another embodiment of the present invention, a FinFET may be doped to reduce resistance. For example, FIG. 10 illustrates the cross-section of semiconductor device 1000 that includes a buried oxide layer 1010 that may be formed on a substrate. A fin 1020, comprising silicon, and a gate dielectric 1030 may be formed on the top surface and sidewalls of fin 1020 in a conventional manner, as illustrated in FIG. 10. Next, a polysilicon layer 1040 may be deposited, as illustrated in FIG. 10. Polysilicon layer 1040 may then be doped with n-type or p-type impurities. After the doping, a second polysilicon layer 1050 may be deposited, as illustrated in FIG. 10. Polysilicon layer 1050 may then be doped with n-type or p-type impurities. Polysilicon layers 1040 and 1050 may then be patterned and etched to form one or more gates. The resulting semiconductor device 1000 experiences reduced poly resistance as compared to conventional devices.

In the previous descriptions, numerous specific details are set forth, such as specific materials, structures, chemicals, processes, etc., in order to provide a thorough understanding of the present invention. However, the present invention can be practiced without resorting to the specific details set forth herein. In other instances, well known processing structures have not been described in detail, in order not to unnecessarily obscure the thrust of the present invention.

The dielectric and conductive layers used in manufacturing a semiconductor device in accordance with the present invention can be deposited by conventional deposition techniques. For example, metallization techniques, such as various types of CVD processes, including low pressure CVD (LPCVD) and enhanced CVD (ECVD) can be employed.

The present invention is applicable in the manufacturing of double-gate semiconductor devices and particularly in FinFET devices with design features of 100 nm and below. The present invention is applicable to the formation of any of various types of semiconductor devices, and hence, details have not been set forth in order to avoid obscuring the thrust of the present invention. In practicing the present invention, conventional photolithographic and etching techniques are employed and, hence, the details of such techniques have not been set forth herein in detail.

Only the preferred embodiments of the invention and a few examples of its versatility are shown and described in the present disclosure. It is to be understood that the invention is capable of use in various other combinations and environments and is capable of modifications within the scope of the inventive concept as expressed herein.

What is claimed is:

1. A method of forming a plurality of fins in a FinFET device, comprising:

depositing a dielectric layer over a silicon on insulator (SOI) wafer, the SOI wafer comprising a conductive layer on an insulating layer;

forming a resist mask over portions of the dielectric layer;

etching a trench in a portion of the dielectric layer not covered by the resist mask, the trench having two side walls;

forming spacers adjacent the two sidewalls of the trench, the spacers comprising a conductive material and having a width ranging from about 100 Å to about 500 Å;

etching the dielectric layer to form dielectric structures located below the spacers, the dielectric structures having a width approximately equal to the width of the spacers;

etching the conductive layer to form the plurality of fins; and removing the spacers and the dielectric structures.

2. The method of claim 1, wherein a pitch of the plurality of fins ranges from about 500 Å to about 1500 Å.

3. The method of claim 1, wherein the forming a resist mask over a portion of the dielectric layer includes:

depositing a photoresist material over the dielectric layer, and forming at least a first opening in the photoresist material, wherein the opening exposes the dielectric layer and a distance between at least two of the plurality of fins is defined in part by the width of the first opening.

4. The method of claim 1, wherein the etching a trench comprises:

etching about 300 Å to about 1000 Å of the dielectric layer not covered by the resist mask.

5. The method of claim 1, wherein the insulating layer comprises a buried oxide layer and the conductive layer comprises at least one of silicon and germanium.

6. The method of claim 5, wherein the spacers comprise silicon.

7. The method of claim 1, wherein the dielectric layer comprises a silicon oxide.

8. The method of claim 1, wherein the plurality of fins consists of two fins.

9. A method of manufacturing a semiconductor device, comprising:

depositing a film over a conductive layer, the conductive layer being used to form a plurality of fin structures;

etching at least one trench in a portion of the film, a first one of the at least one trench having two side walls;

forming spacers adjacent the two sidewalls of the first trench, the spacers having a first width and comprising a conductive material;

etching the film, the etching terminating on the conductive layer with the spacers acting as a mask to prevent etching of portions of the film located below the spacers, the un-etched portions of the film forming a first plurality of structures approximately equal in width to the first width;

etching the conductive layer, the first plurality of structures acting as a mask to prevent portions of the conductive layer from being etched, the un-etched portions of the conductive layer forming the fin structures;

forming a source region and a drain region;

depositing a gate material over the fin structures; and patterning and etching the gate material to form at least one gate electrode.

10. The method of claim 9, wherein a distance between the plurality of fin structures ranges from about 500 Å to about 1500 Å.

11. The method of claim 9, wherein the etching at least one trench comprises:

etching about 300 Å to about 1000 Å into a top surface of the film not covered by a resist mask.

12. The method of claim 9, wherein the etching at least one trench comprises:

etching at least one trench having a predetermined width, wherein a pitch of at least two of the plurality of fin structures is based on the predetermined width.

13. The method of claim 9, wherein the conductive layer is formed on a buried oxide layer that is formed on a semiconducting material, the conductive layer comprising at least one of silicon and germanium, the film comprising a silicon oxide and the spacers comprising silicon.

14. The method of claim 9, wherein the at least one gate electrode comprises two gate electrodes, a first gate electrode being located on a first side of the plurality of fin structures and a second gate electrode being located on an opposite side of the plurality of fin structures.

15. A method of forming a plurality of structures in a semiconductor device, comprising:

depositing a film over a conductive layer;

etching at least one trench in a portion of the film;

forming conductive spacers along sidewalls of the at least one trench;

etching the film, the etching terminating on the conductive layer; and etching the conductive layer to form the plurality of structures wherein the semiconductor device comprises a finFET device and the plurality of structures comprise fins.

16. The method of claim 15, wherein the film comprises a dielectric material and the etching the film forms dielectric structures below the spacers, the method further comprising:

removing the spacers and the dielectric structures.

17. The method of claim 15, wherein the plurality of structures comprises a plurality of fins and the at least one trench comprises two trenches, the two trenches being laterally separated by a predetermined distance and each of the two trenches having a predetermined width.

18. The method of claim 17, wherein a distance between a first fin and a second fin is defined by the predetermined width.

19. The method of claim 18, wherein a distance between the second fin and a third fin is defined by the predetermined distance.

* * * * *